(12) United States Patent
Chang

(10) Patent No.: US 6,399,259 B1
(45) Date of Patent: Jun. 4, 2002

(54) METHOD OF FORMING ALIGNMENT MARKS FOR PHOTOLITHOGRAPHIC PROCESSING

(75) Inventor: Ching-Yu Chang, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/734,285

(22) Filed: Dec. 11, 2000

(30) Foreign Application Priority Data

Nov. 2, 2000 (TW) .......................................... 89123050

(51) Int. Cl.$^7$ ................................................. G03C 5/00
(52) U.S. Cl. ........................ 430/22; 430/312; 430/314; 430/950
(58) Field of Search .......................... 430/22, 312, 314, 430/950

*Primary Examiner*—Christopher G. Young
(74) *Attorney, Agent, or Firm*—J. C. Patents

(57) ABSTRACT

An alignment method for photolithography, especially for forming an alignment marker on a substrate after ion implantation. A substrate that includes a device region and an alignment mark region is provided. A first patterned photoresist layer is formed over the substrate. The first patterned photoresist layer includes an alignment marker within the alignment mark region and an ion implantation pattern within the device region. Using the first patterned photoresist layer as a mask, an ion implantation is carried out to form a plurality of doped regions. A second patterned photoresist layer that exposes the alignment marker is formed over the ion-implant pattern of the first patterned photoresist layer. Using the alignment marker as a mask, the substrate is etched to form a plurality of recess regions.

20 Claims, 9 Drawing Sheets

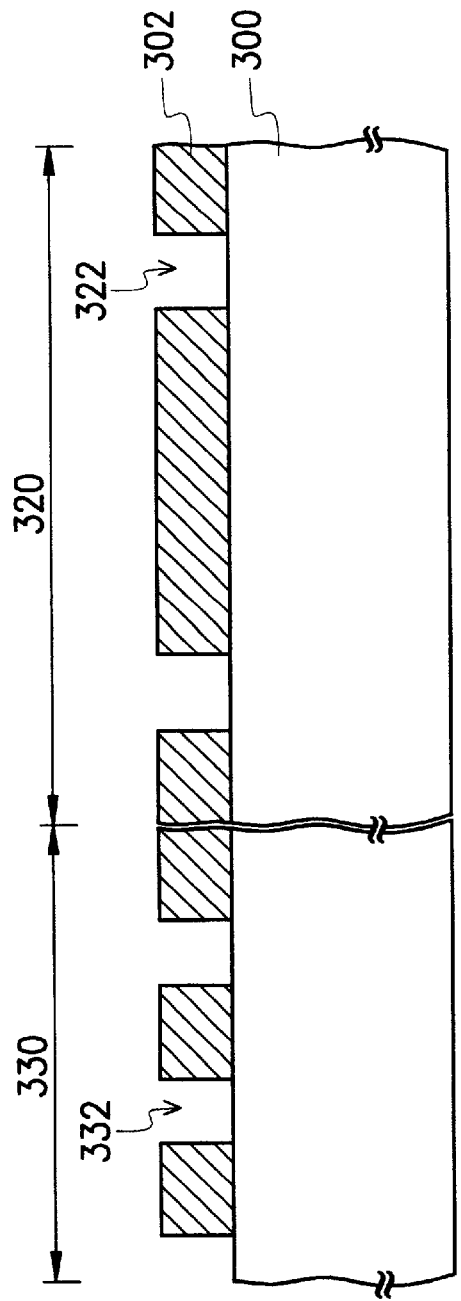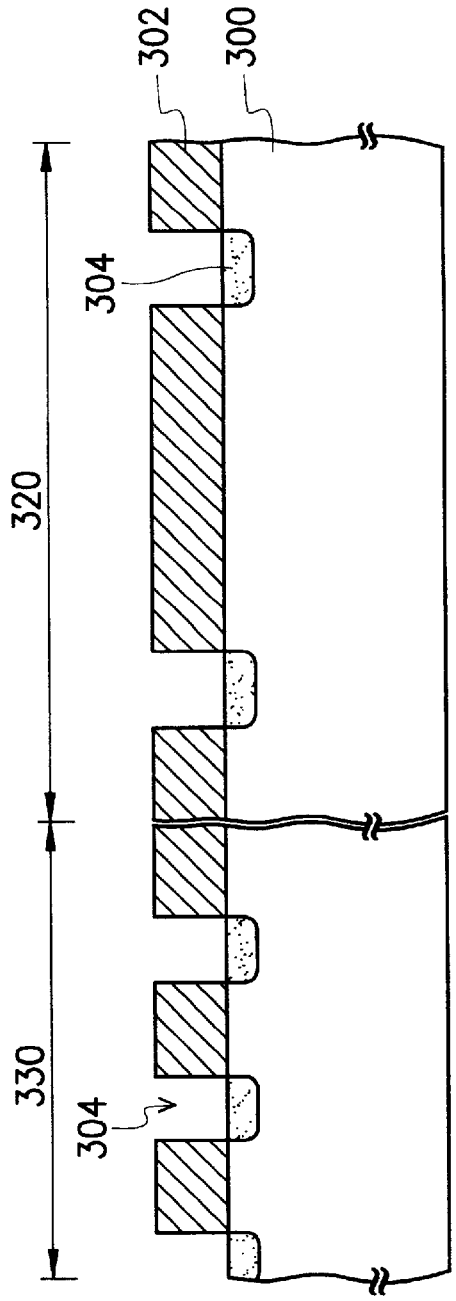

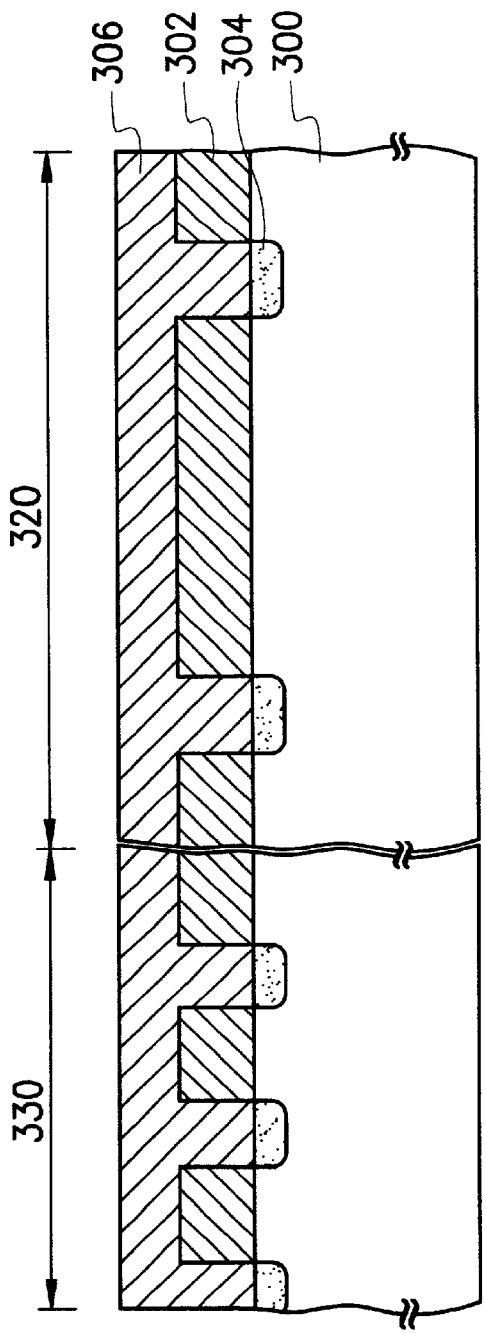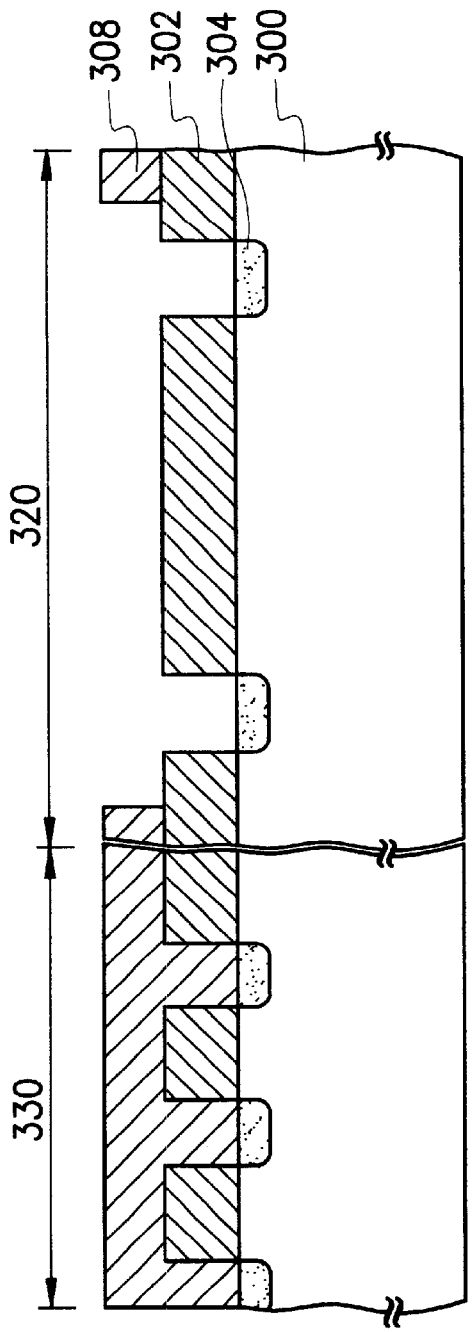

METHOD OF FORMING ALIGNMENT MARKS FOR PHOTOLITHOGRAPHIC PROCESSING

CROSS-REFERENCE TO RELATED APPLICATION

This application claims the priority benefit of Taiwan application serial no. 89123050, filed Nov. 2, 2000.

BACKGROUND OF THE INVENTION

1. Field of Invention

The present invention relates to an alignment method for photolithographic processing. More particularly, the present invention relates to a method of forming alignment marks after ion implantation to serve as aligning markers for subsequent processes.

2. Description of Related Art

Photolithography is one of most important processes for fabricating semiconductor circuits. Photolithographic processes are used in the transfer of a pattern onto a thin film and the fabrication of a mask for ion implantation. In general, photolithographic processing is conducted many times in the production of a semiconductor circuits. In a photolithographic step, one critical factor is pattern alignment. A wafer to be processed not only must be aligned and leveled relative to the stepper machine performing the patterning, the wafer must also be properly aligned relative to the previous pattern. Conventionally, an alignment mark or marks are used for alignment before carrying out photo-exposure. Moreover, an after development inspection (ADI) is conducted after exposure and chemical development.

Alignment markers are often formed outside the device region at the same time as thin film such as an insulation layer or a conductive layer is patterned. Typically, the alignment marker has a circular or linear shape. Optical alignment is generally achieved by aligning with the protruding or recess alignment markers on different thin film layers.

FIGS. 1A through 1D are schematic cross-sectional views showing the progression of steps for forming conventional alignment markers before conducting an ion implantation. Conventional ion implantation is carried out using a patterned photoresist layer as a mask. In this embodiment, the use of alignment pattern is explained with respect to performing an ion implantation. As shown in FIG. 1A, a silicon substrate 100 having a device region for forming semiconductor device is provided. The substrate 100 also has an alignment mark region normally located close to the scribe line of a wafer for forming alignment markers. A photoresist layer 102 is formed over the substrate 100. The photoresist layer contains openings that expose ion-implant regions within the device region and alignment markers for machine positioning.

As shown in FIG. 1B, an ion implantation is carried out using the patterned photoresist layer 102 as a mask to from a doped region 104 such as the source/drain region of a metal-oxide-semiconductor (MOS) transistor. Meanwhile, another doped region 104 is also formed in the alignment mark region to serve as an alignment marker. As shown in FIG. 1C, the photoresist layer 102 is removed.

As shown in FIG. 1D, subsequent photolithographic processing is conducted. Another patterned photoresist layer is formed over the substrate 100. The alignment marker 106 formed during patterning must be inspected for accuracy with the previous alignment marker. However, after a conventional ion implantation, only an alignment marker doped region remains in the alignment mark region. Since no step height or protrusions are formed on the wafer surface, gauging alignment by detecting optical diffraction signal is almost impossible. Hence, judging alignment accuracy of the alignment marker 106 relative to the marker created during ion implantation is difficult.

SUMMARY OF THE INVENTION

Accordingly, one object of the present invention is to provide a method of forming alignment marker for photolithographic processing. The method is capable of producing an alignment marker that has a step height for gauging optical alignment after a subsequent process.

To achieve these and other advantages and in accordance with the purpose of the invention, as embodied and broadly described herein, the invention provides a method for forming an alignment marker on a substrate after ion implantation. A substrate that includes a device region and an alignment mark region thereon is provided. A first patterned photoresist layer is formed over the substrate. The first patterned photoresist layer includes an alignment marker within the alignment mark region and an ion implantation pattern within the device region. Using the first patterned photoresist layer as a mask, an ion implantation is carried out to form a plurality of doped regions. A second patterned photoresist layer that exposes the alignment marker is formed over the ion-implant pattern of the first patterned photoresist layer. Using the alignment marker as a mask, the substrate is etched to form a plurality of recess regions in the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A through 3G are schematic cross-sectional views showing the progression of steps for forming an alignment marker according to a second preferred embodiment of this invention.

DESCRIPTION OF THE PREFERRED EMBODIMENTS

Figure 1A:
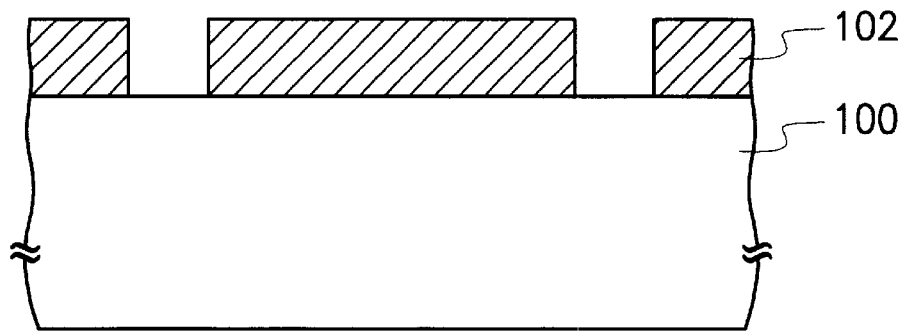
FIGS. 1A through 1D are schematic cross-sectional views showing the progression of steps for forming conventional alignment markers before conducting an ion implantation.
Figure 1B:
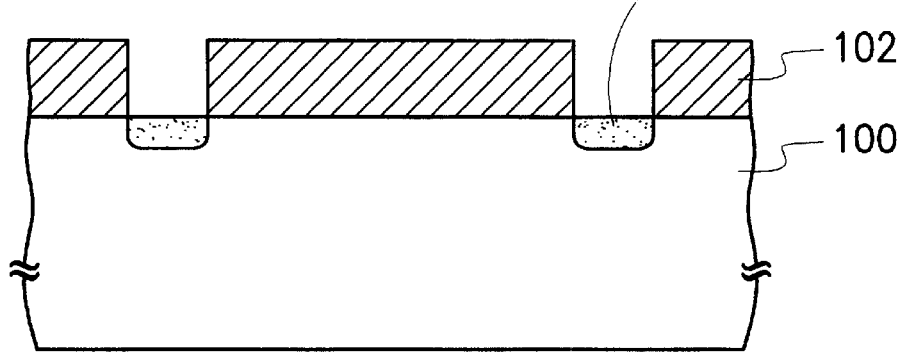
Figure 1C:
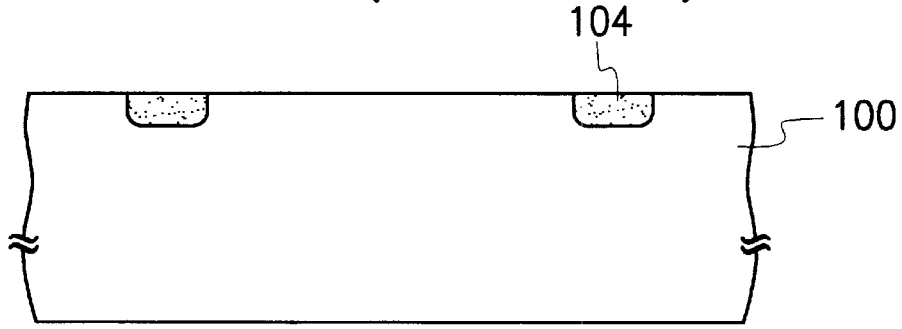
Figure 1D:
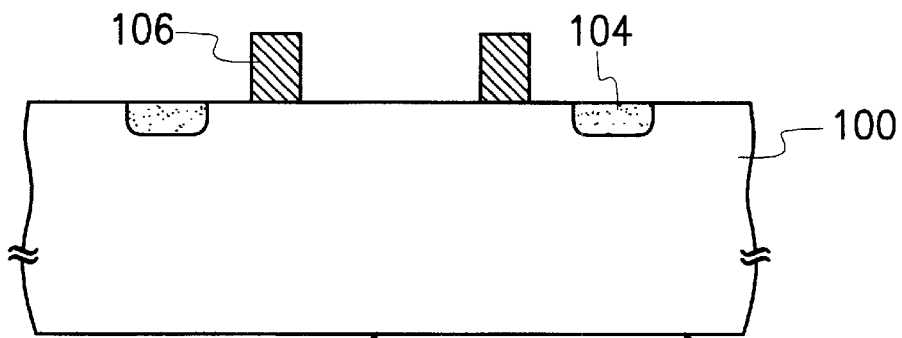

Reference will now be made in detail to the present preferred embodiments of the invention, examples of which are illustrated in the accompanying drawings. Wherever possible, the same reference numbers are used in the drawings and the description to refer to the same or like parts.

Figure 2A:
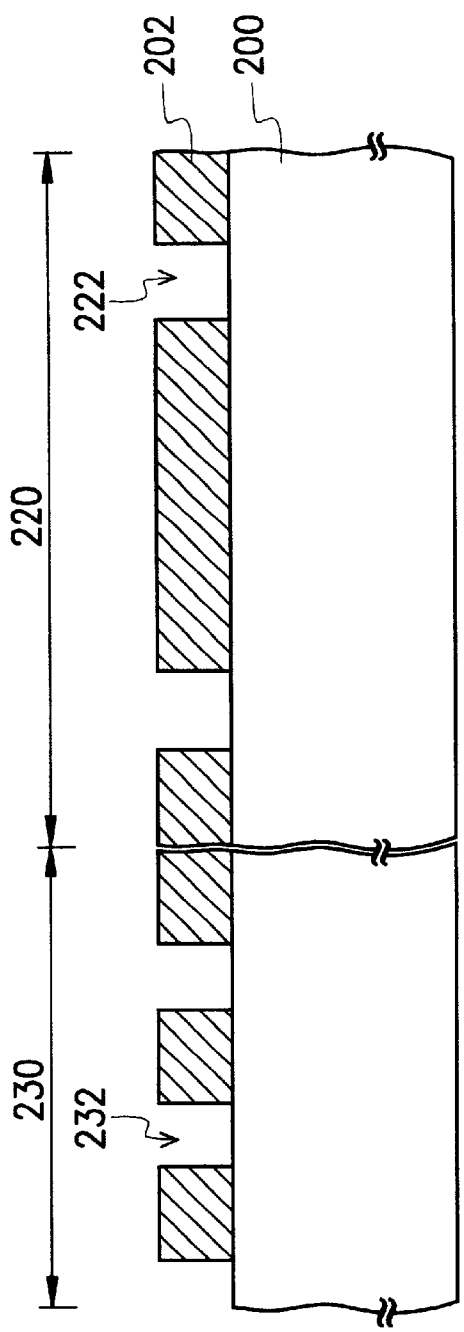
FIGS. 2A through 2G are schematic cross-sectional views showing the progression of steps for forming an alignment marker according to a first preferred embodiment of this invention.

FIGS. 2A through 2G are schematic cross-sectional views showing the progression of steps for forming an alignment marker according to a first preferred embodiment of this invention. As shown in FIG. 2A, a silicon substrate 200 having a device region 230 and an alignment mark region 220 is provided. A first patterned photoresist layer 202 is formed over the substrate 200. The first patterned photoresist layer 202 exposes an ion-implant region 232 within the device region 230 as well as an alignment marker shape 222 in the alignment mark region 220.

Figure 2B:
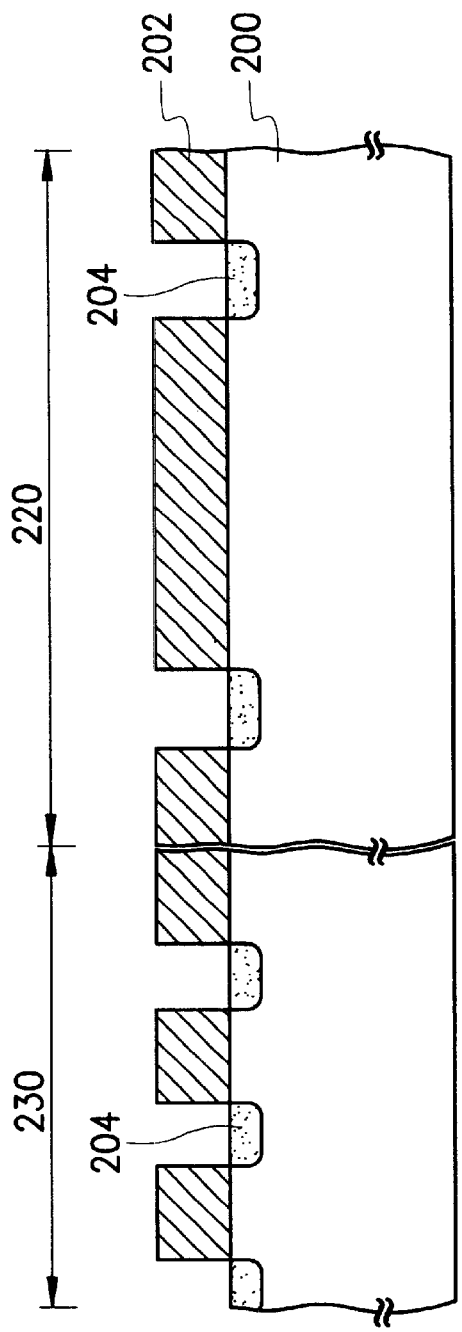
Figure 2C:
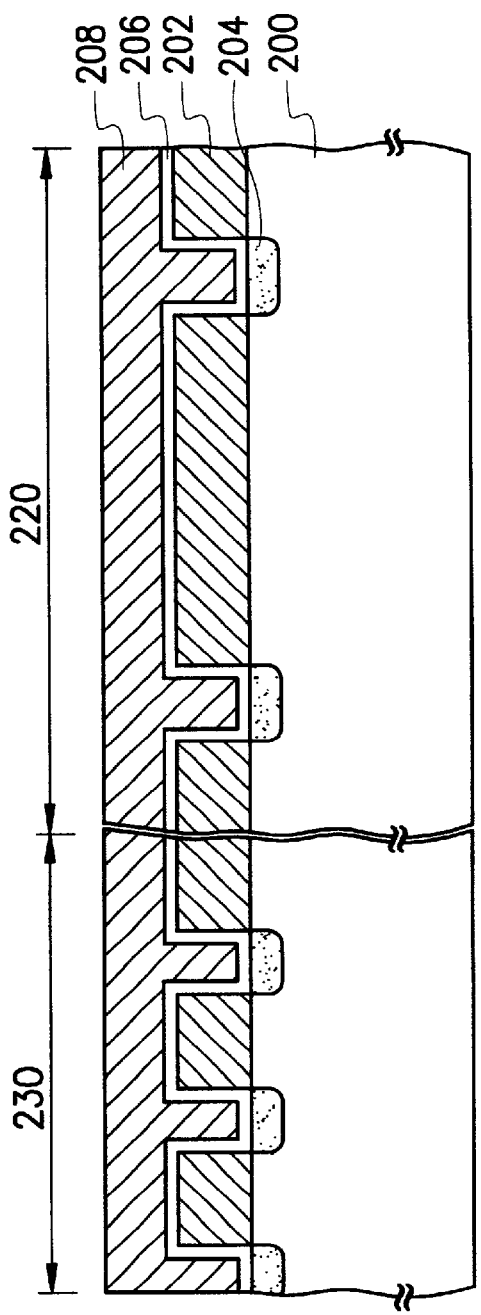

As shown in FIG. 2B, an ion implantation is conducted using the first patterned photoresist layer 202 as a mask to form doped regions 204. As shown in FIG. 2C, a bottom anti-reflection coating (BARC) and another photoresist layer 208 are sequentially formed over the first patterned photoresist layer 202. The BARC 206 is formed by coating a high molecular weight polymer over the substrate 200, for example.

Figure 2D:
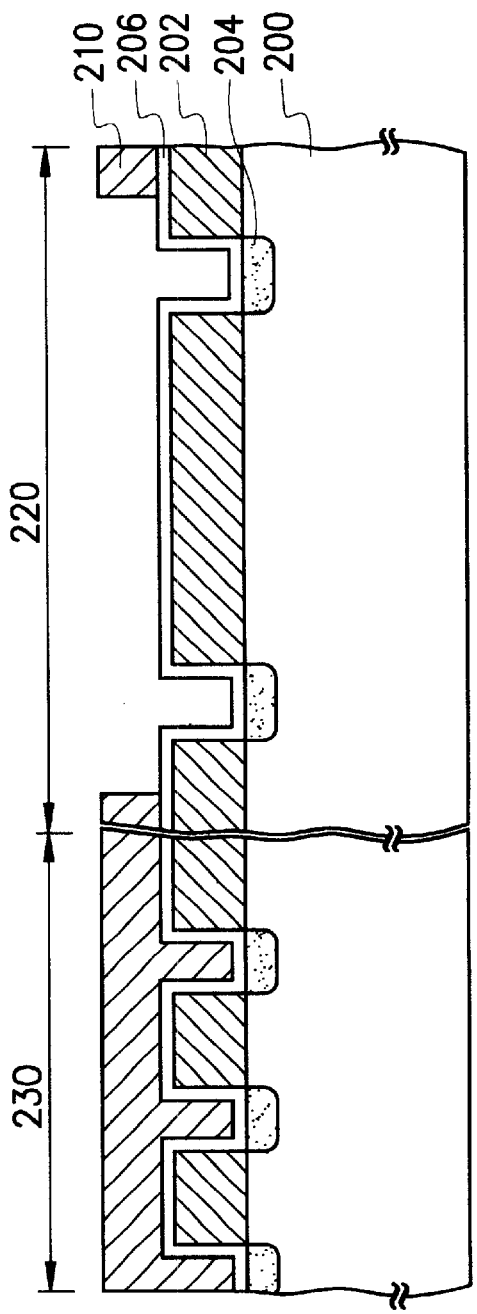

As shown in FIG. 2D, the photoresist layer 208 is photo-exposed and then chemically developed to form a second patterned photoresist layer 210 that covers the device region 230 and expose the BARC 206 in the alignment mark region 220.

Figure 2E:
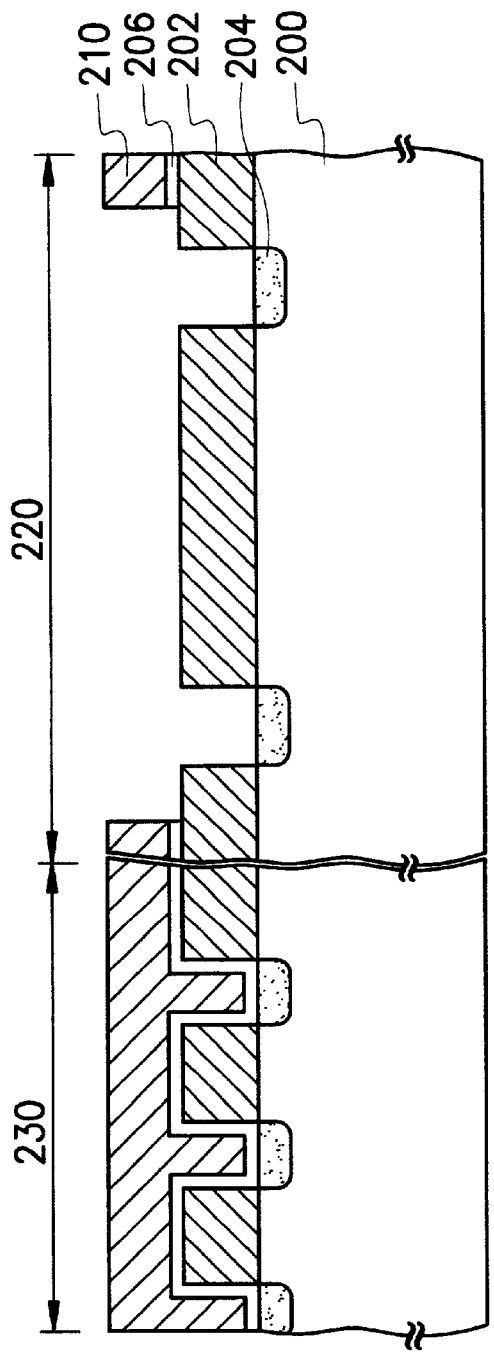

As shown in FIG. 2E, an etching operation is conducted using the second patterned photoresist layer 210 as a mask to remove a portion of the exposed BARC 206 and expose the first patterned photoresist layer 202 and the doped region 204 in the alignment marker region 220. Using the first patterned photoresist layer 202 as a mask, an etching operation is conducted to remove a portion of the substrate 200 to form a plurality of recess regions 212 each having an alignment mark shape. Since the device region 230 is protected by the photoresist layers 202 and 210, the devices in the device region 230 are unaffected by the etching.

Figure 2F:
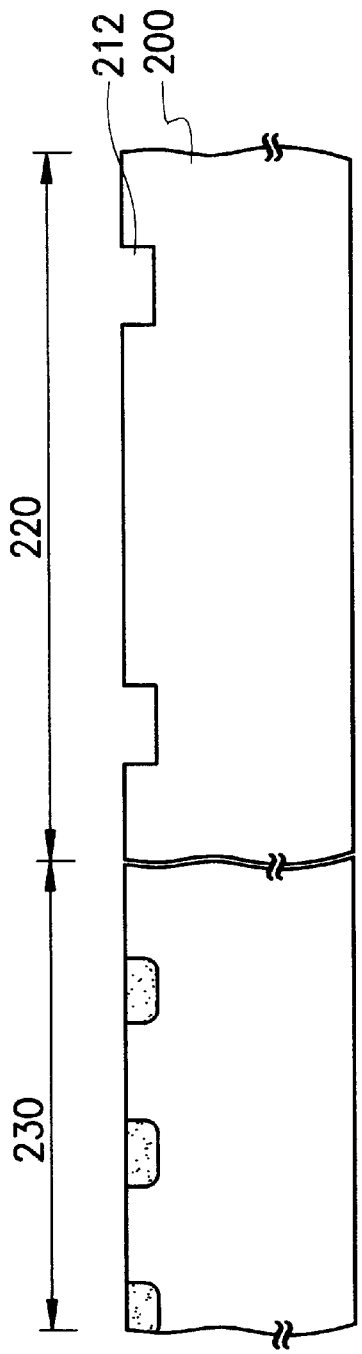

As shown in FIG. 2F, the second patterned photoresist layer 210, the BARC 206 and the first patterned photoresist layer 202 are sequentially removed retaining only recess regions 212 each with a step height difference in the substrate 200.

Figure 2G:
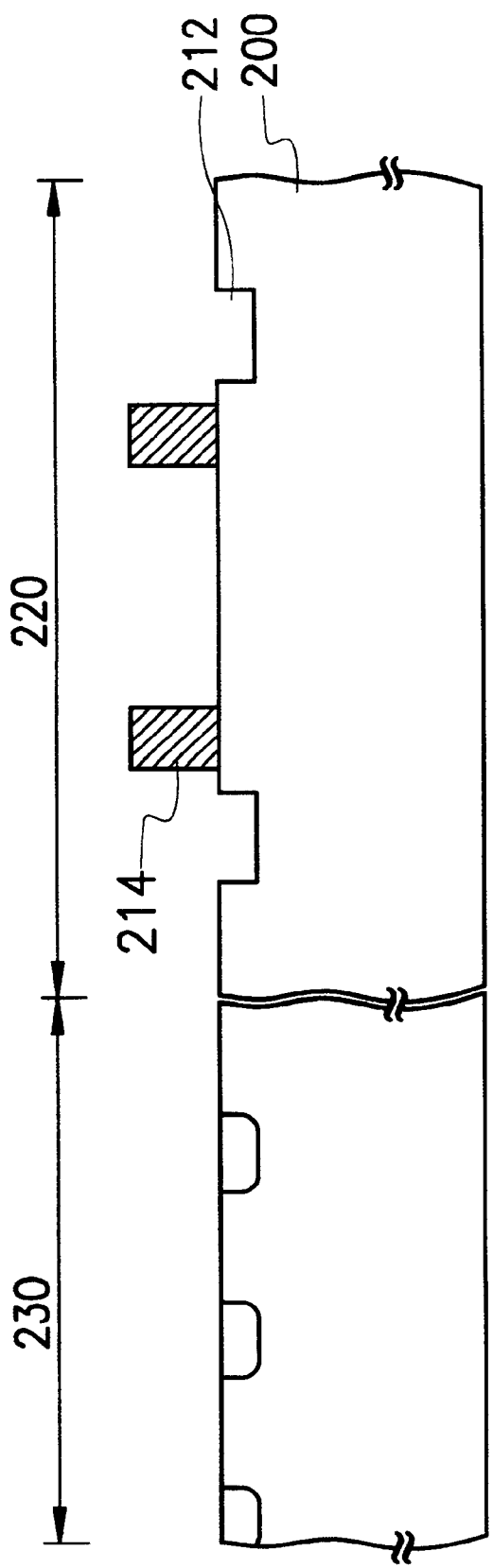

As shown in FIG. 2G, a subsequent photolithographic processing is conducted. The alignment marker 214 of another photoresist layer is formed in the alignment mark region 220. Since the recess regions 212 produced in the previous process all have a step height, the recess region 212 can be gauged with the alignment marker 214 optically. Ultimately, accuracy of pattern alignment between the subsequently formed pattern and the ion implantation pattern can be determined.

In the aforementioned embodiment, both the first patterned photoresist layer and the second patterned photoresist layer can be made from an identical material. This can be done because a bottom anti-reflection coating is formed between the two photoresist layers so that the development of the second patterned photoresist layer will not affect the first patterned photoresist layer. Obviously, the first and the second patterned photoresist layer can be made using different materials. In this case, the bottom anti-reflection coating is not essential. In the following embodiment, the bottom anti-reflection coating is not formed.

Figure 3E:
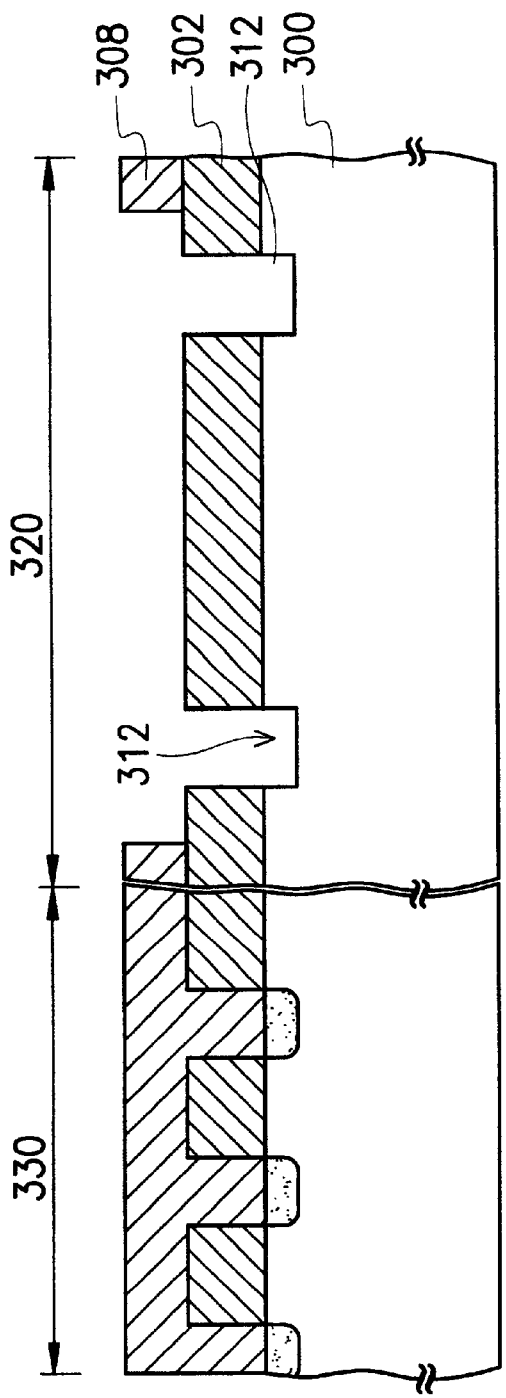

FIGS. 3A through 3G are schematic cross-sectional views showing the progression of steps for forming an alignment marker according to a second preferred embodiment of this invention. As shown in FIG. 3A, a silicon substrate 300 having a device region 330 and an alignment mark region 320 is provided. A first patterned photoresist layer 302 is formed over the substrate 300. The first patterned photoresist layer 302 exposes an ion-implant region 332 within the device region 330 as well as an alignment marker shape 322 in the alignment mark region 320.

As shown in FIG. 3B, an ion implantation is conducted using the first patterned photoresist layer 302 as a mask to form doped regions 304. As shown in FIG. 3C, another photoresist layer 306 is formed over the first patterned photoresist layer 302. The photoresist layer 306 and the first patterned photoresist layer 302 are from an identical material.

As shown in FIG. 3D, the photoresist layer 306 is photo-exposed and then chemically developed to form a second patterned photoresist layer 308. The second patterned photoresist layer 308 covers the device region 330 but exposes the first patterned photoresist layer 302 in the alignment mark region 320 and the doped regions 304 in the alignment mark region 320. Hence, the alignment markers are all exposed.

As shown in FIG. 3E, using the first patterned photoresist layer 302 as a mask, an etching operation is conducted to remove a portion of the exposed substrate 300, thereby forming a plurality of recess regions 312 each having an alignment marker shape.

Figure 3F:
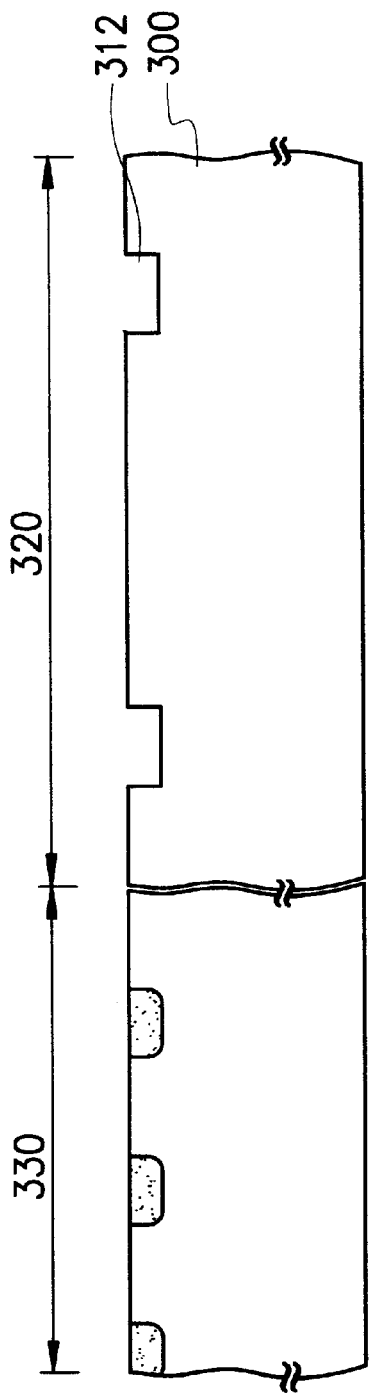

As shown in FIG. 3F, the second patterned photoresist layer 308 and the first patterned photoresist layer 302 are sequentially removed. Only the recess regions 312 with step height are retained in the substrate 300.

Figure 3G:
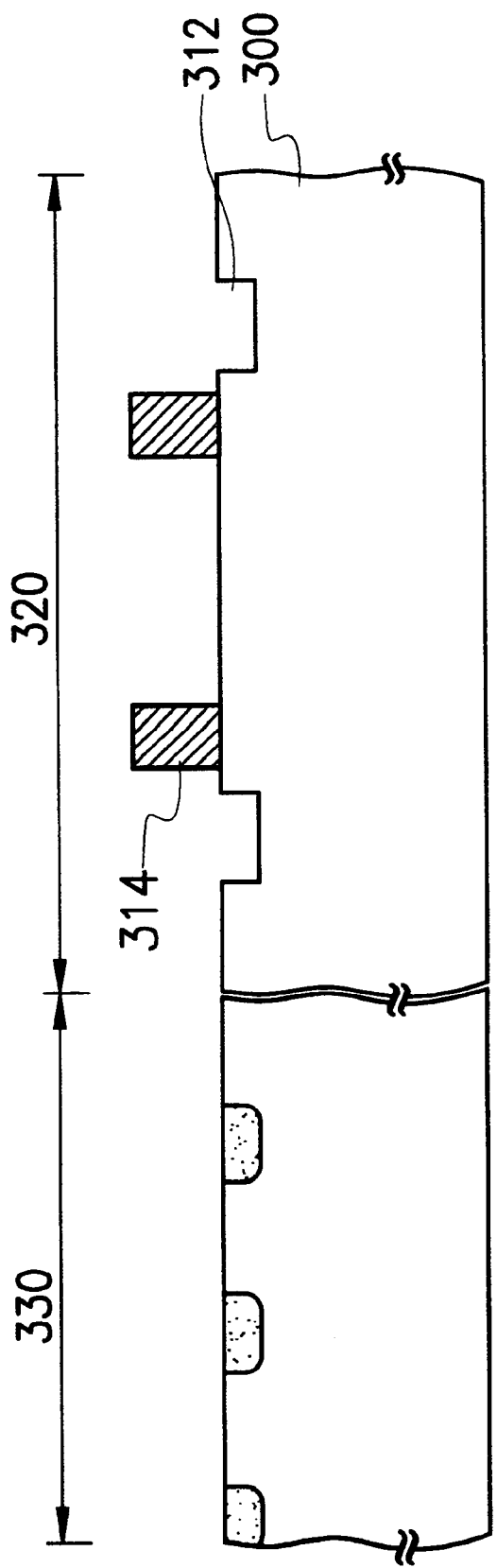

As shown in FIG. 3G, another photoresist layer is formed over the substrate 300 in a subsequent photolithographic process. In the process, an alignment marker 314 is formed in the alignment mark region 320. Since the recess regions 312 produced in the previous process all have a step height, the recess region 312 can be gauged with the alignment marker 314 optically. Ultimately, accuracy of pattern alignment between the subsequently formed pattern and the ion implantation pattern can be determined.

In the aforementioned embodiment, the first patterned photoresist layer serves as a mask in ion implantation. Anyone familiar with semiconductor technologies may notice that the patterned layer can also be a patterned silicon oxide or silicon nitride layer. The patterned layer serves as a sacrificial layer that can be removed after ion implantation. In addition, besides forming an alignment marker with a step height in ion implantation, the invention can also be used in etching process to increase step height of alignment markers. The oxidation process after ion implantation, the alignment marker is etched. The etching process can be replaced by ion implantation so that subsequent oxidation step can be used to form an alignment marker with a greater step height.

In summary, this invention is able to form an alignment marker having a great step height after an ion implantation so that subsequent alignment can be more precise and yield of photolithographic process can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An method of forming an alignment marker in a photolithographic process, in particular, forming an alignment marker in an ion implantation, comprising the steps of:
providing a substrate having a device region and an alignment mark region;
forming a first patterned photoresist layer over the substrate, wherein the first patterned photoresist layer includes an alignment marker in the alignment marker region and an ion implantation pattern in the device region;

performing an ion implantation using the first patterned photoresist layer as a mask so that a plurality of doped regions is formed in the exposed substrate;

forming a second patterned photoresist layer over the ion implantation pattern of the first patterned photoresist layer while exposing the alignment marker;

performing an etching operation using the alignment marker as a mask so that a plurality of recess regions is formed in the substrate; and removing the second patterned photoresist layer and the first patterned photoresist layer.

2. The method of claim 1, wherein the first patterned photoresist layer and the second patterned photoresist layer are made from different materials.

3. The method of claim 1, wherein before the step of forming the second patterned photoresist layer further includes forming a bottom anti-reflection coating so that the second photoresist layer exposes the bottom anti-reflection coating corresponding in position to the alignment marker.

4. The method of claim 3, wherein the first patterned photoresist layer and the second patterned photoresist layer are made from identical material.

5. The method of claim 3, wherein before performing the etching step further includes removing the exposed bottom anti-reflection coating.

6. The method of claim 3, wherein material constituting the bottom anti-reflection coating includes high molecular weight polymer.

7. An method of forming an alignment marker in a photolithographic process, in particular, forming an alignment marker in an ion implantation, comprising the steps of:

providing a substrate having a device region and an alignment mark region;

forming a first patterned photoresist layer over the substrate, wherein the first patterned photoresist layer includes an alignment marker in the alignment marker region and an ion implantation pattern in the device region;

performing an ion implantation using the first patterned photoresist layer as a mask so that a plurality of doped regions is formed in the exposed substrate;

forming a bottom anti-reflection coating over the first patterned photoresist layer;

forming a second patterned photoresist layer over the bottom anti-reflection coating, the device region while exposing the bottom anti-reflection coating above the alignment marker;

removing the exposed bottom anti-reflection coating;

performing an etching operation using the alignment marker as a mask so that a plurality of recess regions is formed in the substrate; and sequentially removing the second patterned photoresist layer, the bottom anti-reflection coating and the first patterned photoresist layer.

8. The method of claim 7, wherein the first patterned photoresist layer and the second patterned photoresist layer are formed using different materials.

9. The method of claim 7, wherein the first patterned photoresist layer and the second patterned photoresist layer are formed from an identical material.

10. The method of claim 7, wherein material constituting the bottom anti-reflection coating includes high molecular weight polymer.

11. A photolithographic alignment method, comprising the steps of:

providing a substrate having a device region and an alignment mark region thereon;

forming a patterned sacrificial layer over the substrate, wherein the patterned sacrificial layer includes at least an alignment marker in the alignment mark region;

performing a first process using the patterned sacrificial layer as a mask;

forming a patterned photoresist layer over the patterned sacrificial layer, wherein the patterned photoresist layer exposes the alignment marker;

performing a second process using the alignment marker as a mask so that a plurality of alignment regions each having a step height is form on the substrate; and removing the patterned photoresist layer and the patterned sacrificial layer.

12. The alignment method of claim 11, wherein material forming the patterned sacrificial layer is selected from a group consisting of silicon oxide, silicon nitride and photoresist.

13. The alignment method of claim 11, wherein the first process includes an ion implantation.

14. The alignment method of claim 11, wherein the first process includes etching.

15. The alignment method of claim 11, wherein the second process includes etching.

16. The alignment method of claim 11, wherein the second process includes oxidation.

17. The alignment method of claim 11, wherein before the step of forming the patterned photoresist layer, further includes the step of forming a bottom anti-reflection coating over the patterned sacrificial layer so that the subsequently formed patterned photoresist layer exposes the bottom anti-reflection coating above the alignment marker.

18. The alignment method of claim 17, wherein the patterned sacrificial layer and the patterned photoresist layer are made from identical material.

19. The alignment method of claim 11, wherein the second process includes etching.

20. The alignment method of claim 11, wherein the first process is an ion implantation and the second process is an ion implantation together with an oxidation process.

* * * * *